United States Patent
Hotchkiss et al.

[11] Patent Number: 5,909,634
[45] Date of Patent: Jun. 1, 1999

[54] METHOD AND APPARATUS FOR FORMING SOLDER ON A SUBSTRATE

[75] Inventors: Gregory B. Hotchkiss, Richardson; Gary D. Stevens, Dallas, both of Tex.

[73] Assignee: Texas Instruments, Dallas, Tex.

[21] Appl. No.: 08/993,636

[22] Filed: Dec. 18, 1997

Related U.S. Application Data

[60] Provisional application No. 60/033,135, Dec. 20, 1996.
[51] Int. Cl.$^6$ ........................................... H01L 21/44
[52] U.S. Cl. ..................... 438/612; 438/613; 438/615; 438/127
[58] Field of Search ..................... 438/612, 613, 438/615, 126, 127

[56] References Cited

U.S. PATENT DOCUMENTS 5,411,897  5/1995  Harvey et al. ........................ 438/612
5,658,827  8/1997  Aulicino et al. ...................... 438/615
5,672,542  9/1997  Schwiebert et al. ................... 438/615
5,723,369  3/1998  Barber .............................. 438/127

*Primary Examiner*—Kevin M. Picardat
*Assistant Examiner*—D. Mark Collins
*Attorney, Agent, or Firm*—Gary C. Honeycutt; R. L. Donaldson

[57] ABSTRACT

The invention discloses a method for forming solder (114) on a substrate (112). The method includes forming a decal (110) with a plurality of solder regions (113). The method further comprises aligning the decal (110) with the substrate (112) and transferring the solder regions (113) on the decal (110) to the substrate (112).

20 Claims, 5 Drawing Sheets

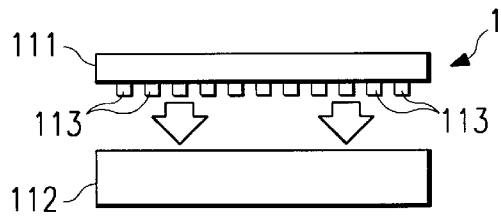
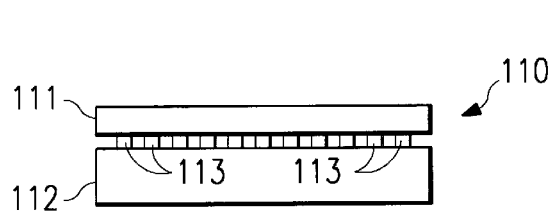
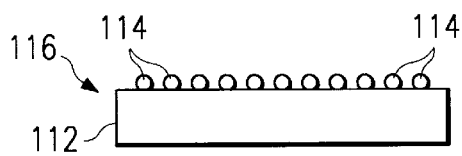
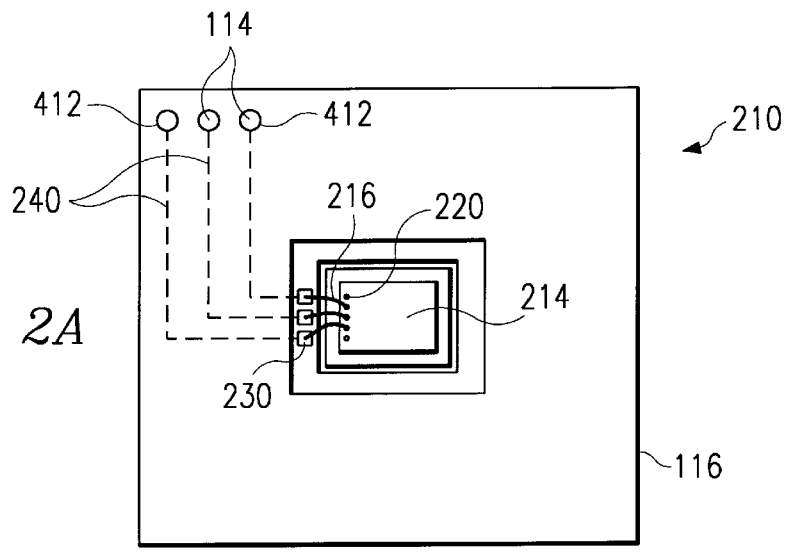
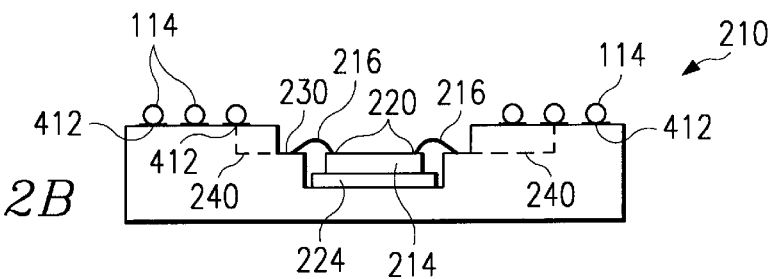
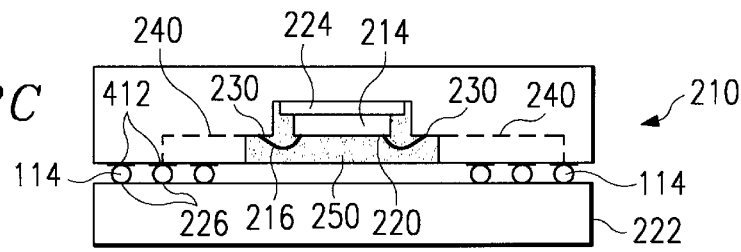

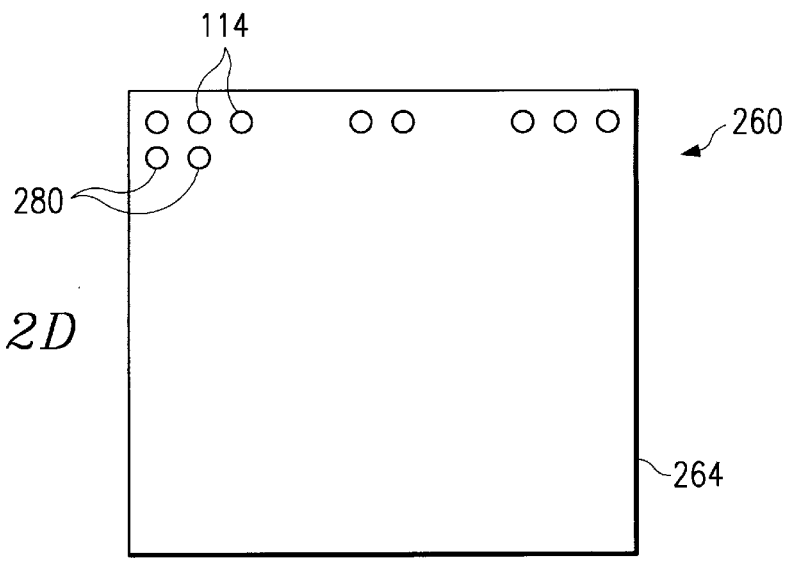
FIG. 2D
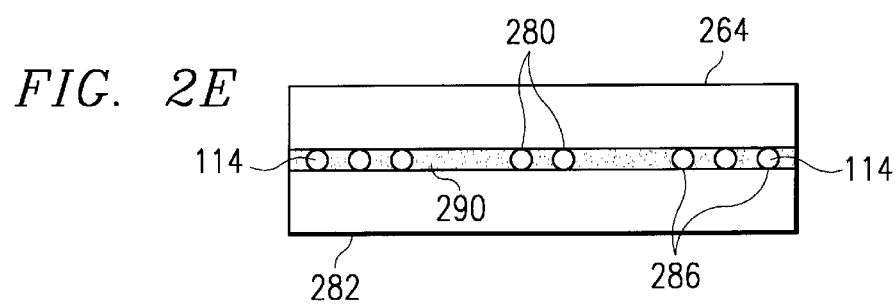
FIG. 2E
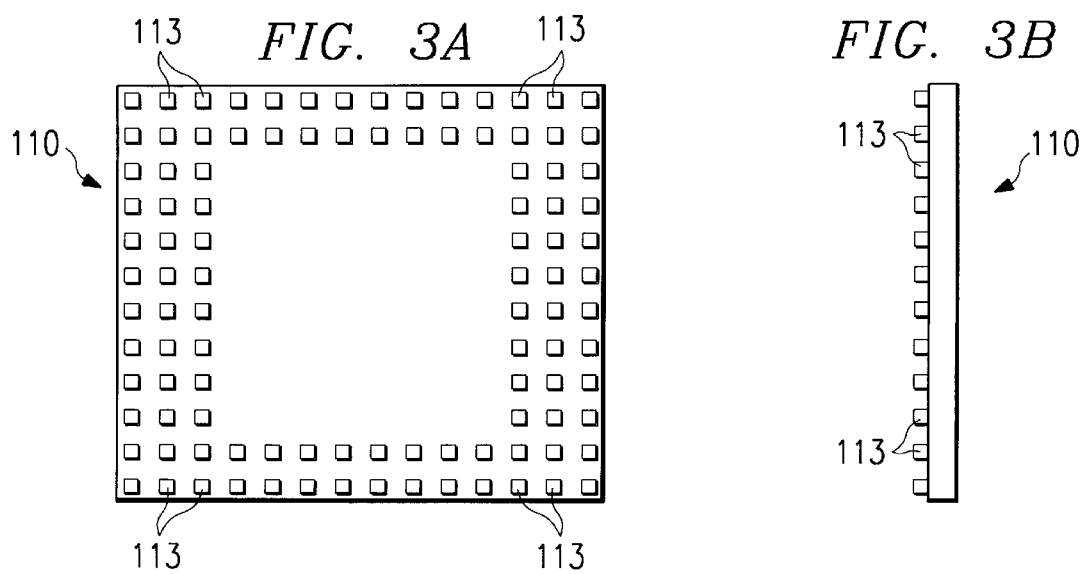
FIG. 3A
FIG. 3B

METHOD AND APPARATUS FOR FORMING SOLDER ON A SUBSTRATE

RELATED APPLICATIONS

This application claims priority under 35 USC § 119(e)(1) of provisional application No. 60/033,135 filed Dec. 20, 1996.

This application is related to co-pending application Ser. No. 08/964,734, entitled Method and Apparatus for Attaching Solder Members to a Substrate, Attorney's Docket TI-24382, both applications having the same assignee.

TECHNICAL FIELD OF THE INVENTION

This invention relates generally to the field of electronic devices packaging and more particularly to a method and apparatus for forming solder on a substrate.

BACKGROUND OF THE INVENTION

Modern electronic components utilize numerous integrated circuits. Often, these integrated circuits must be electrically connected to each other or to other electronic components. One method for connecting integrated circuits to electronic components utilizes a ball grid array electronic package. With a ball grid array electronic package, various input and output ports of an integrated circuit are typically connected via wire bonds to contact pads on the ball grid array electronic package. Solder formed on the contact pads of the ball grid array electronic package are used to complete the connection to another electronic component, such as a printed circuit board. Integrated circuits are also connected to electronic components through a flip-chip electronic package design. The flip-chip electronic package is similar to the ball grid array electronic package in that solder is used to make a connection with other electronic components, such as a printed circuit board. However, solder in a flip-chip design is attached directly to the input and output ports on the face of the integrated circuit. Flip-chip packages do not require wire bonds. One important step in the above described methods for interconnecting electronic components is the formation of solder on the ball grid array package or flip-chip electronic package.

Several conventional methods exist for forming solder on a ball grid array or flip-chip electronic packages. Flip-chip solder bumps may be fabricated on the integrated circuit by evaporation or plating. Another method for attaching solder to a ball grid array electronic package comprises the use of a vacuum chuck to transfer preformed solder balls to the contact pads on the ball grid array electronic package. This method suffers several disadvantages. For example, the minimum distance between solder balls that this method allows may be unacceptable for some electronic packages. Additionally, this conventional method may require two vacuum chucks because while one vacuum chuck is transferring solder balls to the ball grid array electronic package, the other is being filled. The use of one or more vacuum chucks increases the expense associated with this method for forming solder balls on an electronic package.

Another conventional method for forming solder on a ball grid array or flip-chip electronic package utilizes a stencil placed on top of the package. In a typical application, solder paste is applied on top of the stencil and then a squeegee is moved across the top of the stencil forcing the solder paste down through the holes until contact is made directly with the contact pads of the ball grid array or flip-chip electronic package. This method also suffers several disadvantages. For example, the ball grid array or flip-chip electronic packages may be exposed to the harshness of the chemical process associated with such a method. In addition, forcing solder paste through a stencil onto an electronic package require forces that may damage the electronic package. Furthermore, the use of such a method may also result in paste in undesired locations that must be cleaned up. These problems are further compounded in standard silkscreen printing approaches where multiple applications of solder layers are often necessary to provide adequate material.

SUMMARY OF THE INVENTION

Therefore, a need has arisen for a new method and apparatus that overcomes the disadvantages and deficiencies of the prior art. The invention comprises a method and apparatus for forming solder on a substrate.

According to one aspect of the invention, the method comprises the step of forming a decal. The decal comprises a plurality of solder regions. The method further comprises aligning the decal with a substrate and transferring the solder regions on the decal to the substrate.

According to another aspect of the invention, a method for forming solder on a substrate includes the steps of aligning a stencil with a first substrate. The method further comprises placing solder paste on the first substrate through the stencil to form a plurality of solder paste regions on the first substrate. The method further comprises transferring a plurality of solder paste regions to a second substrate.

The invention provides a method for attaching solder to a substrate that facilitates precise alignment of the solder with desired locations on the substrate. Because only the decal requires alignment, precise alignment of the solder with desired locations on the ball grid array package may be made through one alignment process. The invention may enhance the production efficiency by screening out defective decals before shipment to a vendor. A common defect that conventionally occurs during formation of solder on a substrate includes excess paste forming a contact between two conductors. Another example defect is insufficient paste, which may create an open circuit in the resulting electronic device. The present invention enables screening for such defects before transfer to a substrate. This screening process contrasts with conventional screening that may take place after the formation of solder on the ball grid array package.

The invention also allows for the formation at a central site of solder decals that may be shipped to remote locations for transferring the solder to the ball grid array package or integrated circuit. Therefore, much of the equipment conventionally used to place solder on a ball grid array can be eliminated, which may reduce the cost of forming solder on ball grid arrays. Any equipment required to produce that solder decal may reside solely at a centralized location. Formation of a solder decal also facilitates delegation to third parties of a portion of the solder attachment process, which may further reduce costs. Furthermore, the invention provides a cleaner solder formation process because chemical processing may be performed away from the substrate or integrated circuit.

BRIEF DESCRIPTION OF THE DRAWINGS

For a more complete understanding of the present invention and the advantages thereof, reference is now made to the following descriptions taken in connection with the accompanying drawings in which:

FIGS. 1A through 1C are simplified side view illustrations of method steps according to the teachings of the present invention;

FIG. 2A is a top view of an exemplary integrated circuit package utilizing the invention;

FIGS. 2B and 2C are side views of the integrated circuit package shown in FIG. 2A;

FIG. 2D is a top view of a flip-chip electronic package design in which an integrated circuit has solder attached to its contact pads;

FIG. 2E is a side view of the flip-chip electronic package shown in FIG. 2D;

FIG. 3A is a top view of an exemplary solder decal according to the invention;

FIG. 3B is a side view of the solder decal shown in FIG. 3A.

DETAILED DESCRIPTION OF THE INVENTION

Figure 4:
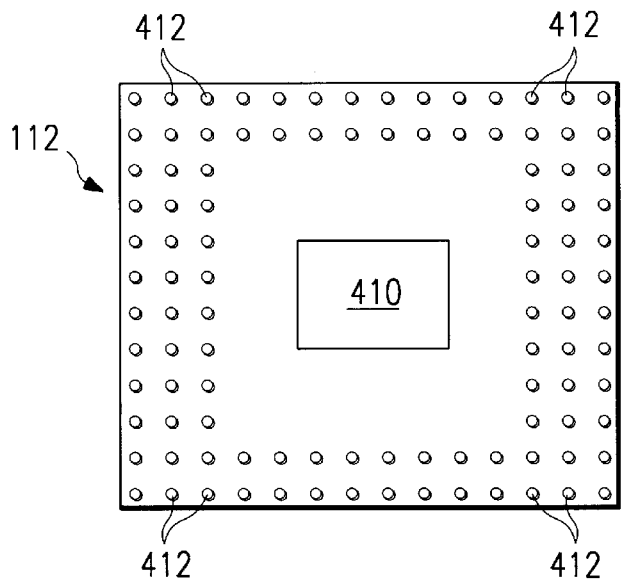
FIG. 4 is a top view of an exemplary ball grid array package.

The preferred embodiments of the present invention and its advantages are best understood by referring to FIGS. 1 through 12 of the drawings, like numerals being used for like and corresponding parts of the various drawings.

FIGS. 1A through 1C are simplified side view illustrations of an embodiment of the invention. In FIG. 1A a ball grid array (BGA) package 112 is illustrated. In one embodiment, the invention provides a method for forming solder on a substrate, such as ball grid array package 112. Ball grid array package 112 may be a conventional ball grid array package. Alternatively, ball grid array package 112 may comprise any suitable substrate to which solder may be attached to facilitate electrical connection of electronic devices. For example, as discussed in greater detail below, solder may be attached directly to an integrated circuit in a flip-chip electronic package. FIG. 1A also illustrates an embodiment of a solder decal 110 according to the invention. Solder decal 110 comprises a substrate 111 with a plurality of solder paste regions or solder bumps 113. Solder paste regions or solder bumps 113 comprise a portion of solder paste. Solder paste is well known. One example of solder paste includes a mixture of very small solder balls, on the order of 30 $\mu$m in diameter, and flux. However, any type of solder paste may be used for solder paste regions 113. According to the invention, solder paste regions 113 are temporarily formed or placed on substrate 111 for subsequent transfer to ball grid array package 112. As discussed in greater detail below, ball grid array package 112 may comprise a plurality of contact pads (not shown explicitly in FIGS. 1A through 1C). According to one embodiment of the invention, solder paste regions 113 may be transferred to the contact pads on ball grid array package 112.

FIG. 1B illustrates the step of aligning solder decal 110 with ball grid array package 112. According to the invention, solder paste regions 113 may be attached to ball grid array package 112 at desired locations by alignment of solder decal 110 with ball grid array package 112, bringing solder paste regions 113 into contact with a portion of ball grid array package 112, and subsequent transfer of solder paste regions to ball grid array package 112. As discussed in greater detail below, solder decal 110 may be placed on top of ball grid array package 112 to facilitate transfer of solder paste regions 113 from solder decal 110 to ball grid array package 112. Alternatively, ball grid array package 112 may be placed on top of solder decal 110. In addition, other suitable orientations of solder decal 110 and ball grid array package 112 that facilitate transfer of solder paste regions 113 to a ball grid array package 112 may be utilized. After aligning solder decal 110 with ball grid array package 112, solder paste regions 113 may be transferred to ball grid array package 112. This transfer process may include a solder reflow process. Solder decal 110 may be removed from solder paste regions to produce an attachment-ready ball grid array package 116, shown in FIG. 1C. Solder decal 110 may be removed from the ball grid array package 112 at various points in the above-described process. For example, solder decal 110 may be removed from solder paste regions and ball grid array package 112 before or after a solder reflow process.

FIG. 1C illustrates an attachment-ready ball grid array package 116. Transferred solder members 114 are securely attached to ball grid array package 112 to form attachment-ready ball grid array package 116. In one embodiment of the invention, solder paste regions 113 are transferred by heating to form transferred solder members 114. In such an embodiment, the transferred solder members 114 take the spherical configuration depicted in FIG. 1C. Transferred solder members 114 formed on attachment-ready ball grid array package 116 may provide a plurality of electrical connection points to facilitate connection of one electronic device to another. The transferred solder members 114 on the attachment-ready ball grid array package 116 may be attached to contact pads of various electronic components, such as a printed circuit board.

FIGS. 2A, 2B, and 2C illustrate one example of a integrated circuit package 210 utilizing an attachment-ready ball grid array package 116 according to the invention. Integrated circuit package 210 comprises an attachment-ready ball grid array package 116 with an integrated circuit 214 formed thereon. Integrated circuit 214 may be attached to attachment-ready ball grid array package 116 with an epoxy 224, as shown in FIG. 2B. Various integrated circuit connection ports 220 are electrically connected via wire bonds 216 to bond pads 230 on attachments ready ball grid array package 116. As shown in FIG. 2A, bond pads 230 are electrically connected to contact pads 412 by electrically conductive interconnect lines 240. Contact pads 412 are shown best in FIG. 4. The interconnect lines 240 may be patterned in one or more layers, with some of the interconnect lines 240 placed below the surface of the attachment-ready ball grid array package 116. Transferred solder members 114 are connected to contact pads 412. Wire bonds 216 may be free-standing wires. As illustrated in FIG. 2C, integrated circuit connection ports 220 are electrically connected to contact pads 226 on a printed circuit board 222 by connecting printed circuit board contact pads 226 to solder members 114. To environmentally protect the integrated circuit 214 from the potentially corrosive nature of the atmosphere, the region surrounding the integrated circuit 214, bond wires 216, and bond pads 230, may be filled with polymeric material 250. Therefore, the formation of transferred solder members 114 on contact pads 412 facilitates connection of printed circuit board contact pads 226 to ball grid array contact pads 412, which allows electrical connection between integrated circuit 214 and printed circuit board 222. Thus, the invention provides a method for forming transferred solder members 114 on a ball grid array 112 that facilitates the connection of an integrated circuit, such as integrated circuit 214, to another electronic component, such as printed circuit board 222.

FIGS. 2D and 2E illustrate an example of a flip-chip electronic package 260, which may be formed according to the invention, and its connection to a printed circuit board 282. As illustrated in FIGS. 2D and 2E, flip-chip electronic package 260 allows connection of the integrated circuit 264 to printed circuit board 282 without the use of wire bonds such as wire bonds 216 and without use of bond pads such as bond pads 230. Transferred solder members 114 are formed directly on various connection ports 280, which are formed flush with a surface of integrated circuit 264. Integrated circuit 264 is substantially similar to integrated circuit 214. Transferred solder members 114 electrically connect the integrated circuit connection ports 280 to contact pads 286 on printed circuit board 282, as shown in FIG. 2E. After connection, a polymeric elastomeric underfill material 290 is applied between the integrated circuit 264 and the printed circuit board 282 to protect the integrated circuit 264 from the environment and to provide strain relief to the electronic package.

FIGS. 3A and 3B further illustrate details of an exemplary of solder decal 110. The solder decal 110 shown in FIGS. 3A and 3B comprises a plurality of solder paste regions 113 formed around the perimeter of solder decal 110 to match a pattern of contact pads 412 formed on ball grid array package 112 shown in FIG. 4.

FIG. 4 illustrates an example of ball grid array package 112. Ball grid array package 112 is formed with an integrated circuit receiving area 410 for placement of an integrated circuit. Ball grid array package 112 is further formed with a plurality of ball grid array contact pads 412 to facilitate connection of the integrated circuit to another electronic device. Contact pads 412 may be formed flush with the surface of ball grid array package 112.

Figure 5:
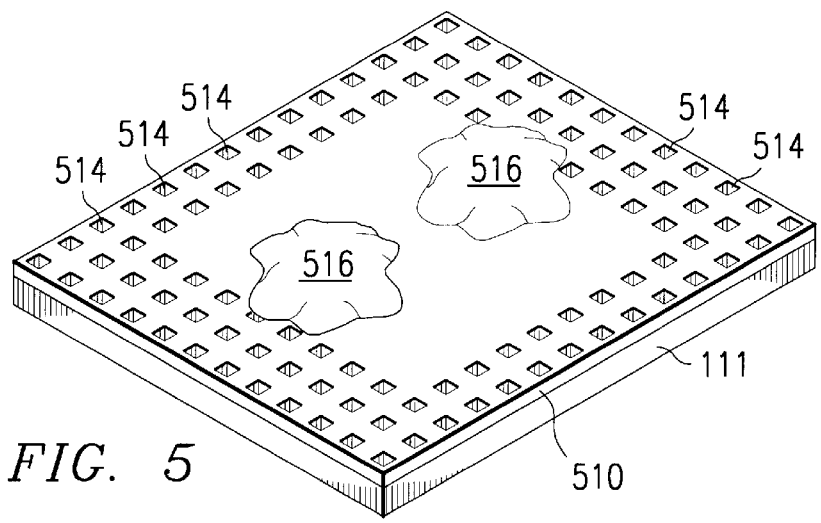
FIG. 5 is a perspective view showing the formation of a solder decal according to the invention.
Figure 7:
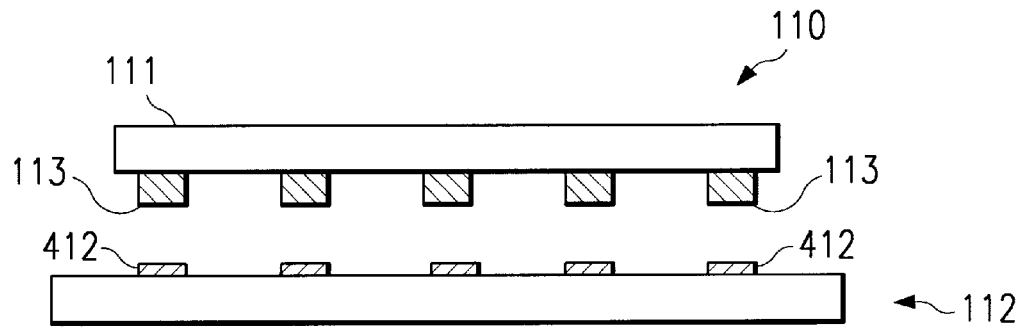
FIG. 7 is a side view of the solder decal shown in FIG. 1A and a side view of the ball grid array package shown in FIG. 1A.
Figure 8:
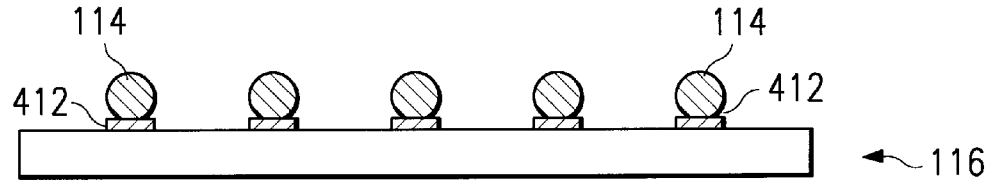
FIG. 8 is a side view of the attachment-ready ball grid array package shown in FIG. 1C and illustrates the transfer of solder from the solder decal to a ball grid array package.
Figure 9:
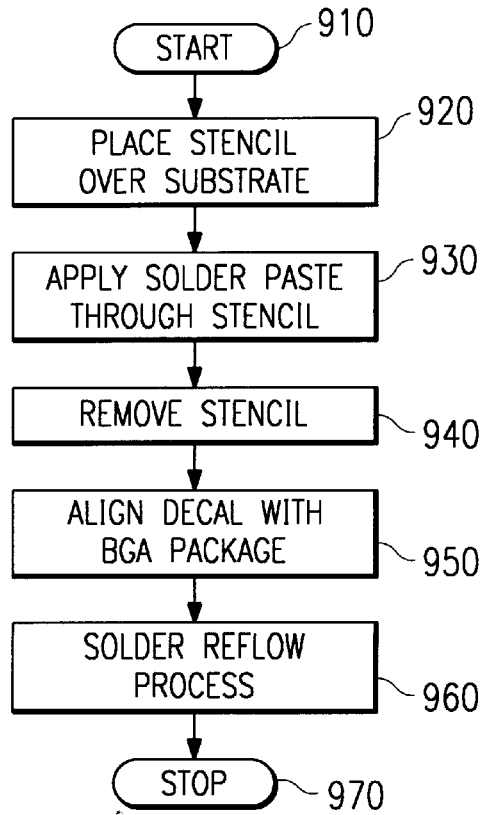
FIG. 9 is a flow chart illustrating one method of forming solder on an electronic package according to the invention.

FIGS. 5 through 8 illustrate the formation of solder on a substrate, such as ball grid array package 112, according to one embodiment of the invention, and FIG. 9 is a flow chart illustrating the steps associated with the formation of solder on a ball grid array package as illustrated in FIGS. 5 though 8. Although the invention is described in the context of forming solder balls on ball grid array package 112, solder may be formed according to the teachings of the invention on a variety of substrates used with electronic devices. Examples of other substrates include, but are not limited to, flip-chip electronic packages, such as flip-chip electronic package 260, and an interposer.

Figure 6:
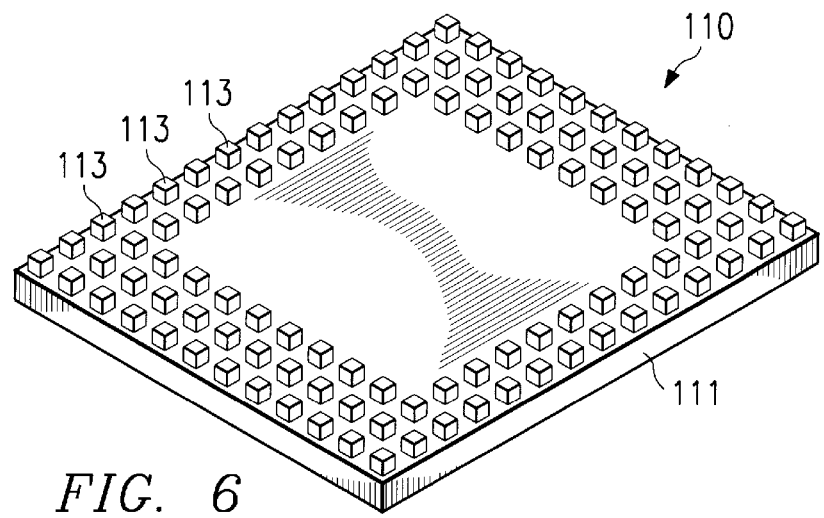
FIG. 6 is a perspective view of the exemplary solder decal shown in FIG. 3A and 3B.

FIG. 5 illustrates the formation of solder decal 110 (FIG. 6). A stencil 510 is placed over a substrate 111. The stencil 510 comprises apertures 514 formed in a pattern to match a pattern of contact pads, such as contact pads 412, on ball grid array package 112 or other substrate. Although apertures 514 are depicted as square in configuration, any suitable configuration for apertures 514 may be used, including circular apertures. The step of placing a stencil over substrate 111 is illustrated at step 920 in the flow chart of FIG. 9. At step 930, solder paste 516 is applied over stencil 510 so that apertures 514 are filled with solder paste 516. After apertures 514 are filled with solder paste 516, stencil 510 may be removed at step 940, leaving solder decal 110 having a plurality of solder paste regions 113. FIG. 6 illustrates a perspective view of solder decal 110, also shown in FIG. 3, and formed according to the above-described procedure. Solder decal 110 may also be formed through other techniques, such as silk screen printing or evaporating solder through a mask.

FIGS. 7 and 8 are side views of solder decal 110 and ball grid array package 112, showing additional details of the solder decal 110 and the ball grid array package 112. Although contact pads 412 may be formed flush with the surface of ball grid array package 112, for clarity, contact pads 412 are illustrated in FIGS. 7 and 8 as protruding above the surface of electronic package 112. After solder paste regions 113 are formed on substrate 111, the ball grid array package 112 is aligned with the solder member decal 110 and solder paste regions 113 are brought into contact with ball grid array contact pads 412. Because solder decal 110 is formed with a pattern of solder paste regions 113 that matches a pattern of contact pads 412 on ball grid array package 112, all of solder paste regions 113 may be aligned with respective contact pads 412 with one alignment step. The alignment of solder decal 110 with ball grid array package 112 is illustrated in FIG. 9 at step 950.

At step 960, solder paste regions 113 are transferred to contact pads 412 of ball grid array 112 to form transferred solder members 114. According to one embodiment of the invention, solder paste regions 113 are transferred to contact pads 412 through a solder reflow process. The solder reflow process securely forms transferred solder members 114 on contact pads 412 of ball grid array package 112. During transfer, the heating of the solder paste regions 113 may cause the transferred solder members 114 to take the spherical configuration illustrated in FIG. 8. Solder reflow processes are well known and a variety of types of solder reflow processes may be used to secure transferred solder members 114 to contact pads 412. Solder reflow processes may be performed in a nonoxidizing atmosphere, such as nitrogen; however, an oxygen atmosphere such as air may also be appropriate.

Solder flux may be placed on either contact pads 412 or solder paste regions 113 before bringing the two into contact with each other and heating both the solder decal 110 and ball grid array package 112. Alternatively, solder decal 110 is removed from ball grid array package 112 before heating the ball grid array package 112, leaving solder paste regions 113 on ball grid array package 112. Various other processes may be incorporated with the invention that are operable to securely attach transferred solder members 114 to contact pads 412, including fluxless solder reflow processes. Substrate 111 may comprise a variety of materials. Although a variety of materials may be used, substrate 111 may comprise materials that can withstand the heat incurred during the transfer process and to which solder will not stick. For example, suitable materials include plastic, aluminum, silicon, quartz or ceramics. Flexible materials may also be used for substrate 111, including paper and plastic. Flexible materials, such as paper and plastic, add flexibility to solder decal 110, which facilitates the transfer process. Paper and plastic are also often less expensive than metals, quartz, and silicon.

The type of solder that may be used in a solder reflow process may be determined by the material used to form the ball grid array package 112. In addition, the type of material that may be used for substrate 111 of solder decal 110 may be affected by the type of solder reflow process selected. For example, high lead solders are conventionally chosen for ceramic packages. If a ball grid array package 112 comprises a ceramic package, high lead solders may be selected. Because high lead solder may require maximum temperatures of 350° C. or more, the material used for substrate 111 may be chosen to withstand that temperature, or alternatively selected so that it will burn off during the solder reflow process.

The method illustrated in FIG. 9 ends at step 970. This method of the invention may be used to form solder on a plurality of substrates in addition to the ball grid array package 112, such as flip-chip electronic package 260 or other substrates.

Figure 10:
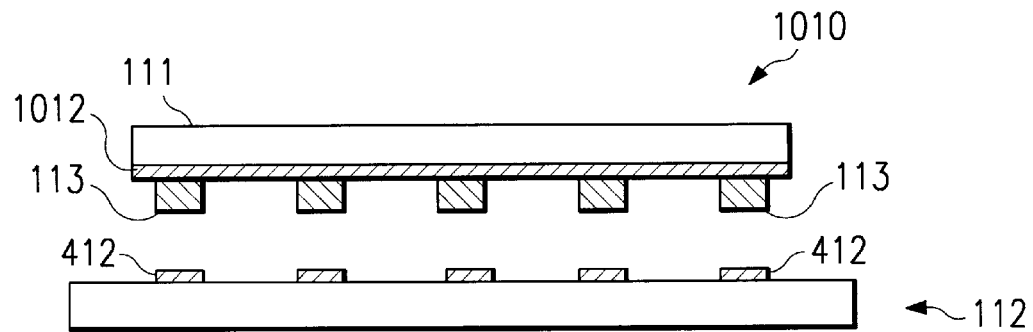
FIG. 10 is a side view of the ball grid array package shown in FIG. 1C and another embodiment of a solder decal according to the invention.

FIG. 10 illustrates another embodiment of a solder member decal 1010 formed according to the invention. Solder member decal 1010 includes a release layer 1012 applied to the surface of substrate 111 to aid in the removal of substrate 111 from solder paste regions 113 after transfer to ball grid array package 112, or other substrate. According to this embodiment, release layer 1010 facilitates removal by providing a layer between substrate 111 and either solder paste regions 113 and transferred solder members 114 that may be easily removed or decomposed through a variety of techniques. For example, release layer 1012 may be removed through thermal decomposition, photo-decomposition, or soaking in an appropriate fluid; however, suitable removal or decomposition methods may be used.

Figure 11:
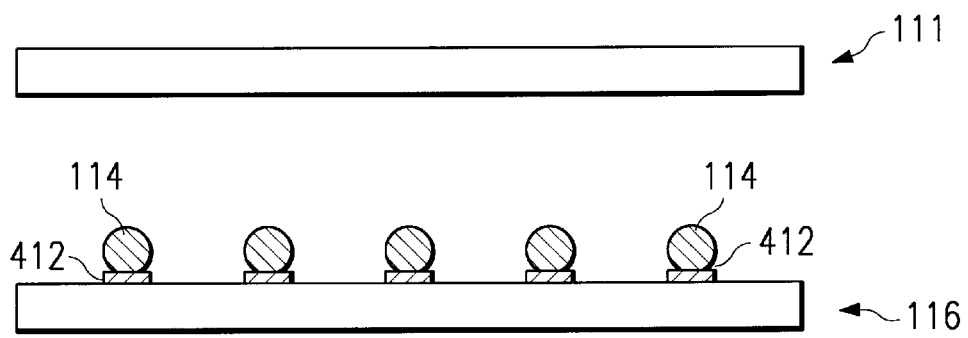
FIG. 11 is a side view of the attachment-ready ball grid array package shown in FIG. 1C after transfer of solder regions and formation of solder members on the ball grid array package and a side view of the solder decal of FIG. 10 after removal of a portion of the decal.

FIG. 11 illustrates substrate 111 after removal of release layer 1012. In the embodiment shown in FIG. 11, removal of release layer 1012 is performed after a reflow process through a variety of techniques. For example, release layer 1012 may be separate from substrate 111 and transferred solder members 114 through soaking solder decal 1010 and ball grid array 112 in water. Soaking decal 1010 and ball grid array 112 causes release layer 1012 to separate from transferred solder members 114 and substrate 111, therefore assisting in the separation of substrate 111 from transferred solder member 114.

Figure 12:
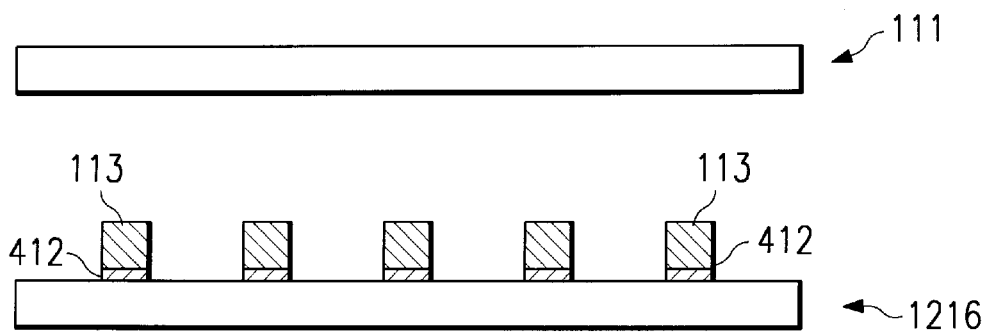
FIG. 12 is a side view of an attachment-ready ball grid array package during formation after transfer of solder regions from the solder member decal of FIG. 10 but before formation of solder members.

Referring now to FIG. 12, another example of the use of release layer 1012 to facilitate removal of decal 1010 from the solder paste regions 113 is illustrated. In this embodiment, removal is facilitated by decomposition of release layer 1012 early in the reflow process. If photo-decomposition is used, contact pads 412 may be prefluxed to hold solder regions 113 in place after release layer is decomposed and until a solder reflow step is performed. Release layer 1012 is illustrated as decomposed in FIG. 12 before solder paste regions 113 have been transformed into transferred solder members 114, resulting in the device 1216 shown in FIG. 12. Further heating may form transferred solder members 114 from solder paste regions 113. Although an appropriate paper material may be used for substrate 111 that decomposes due to heat early in the reflow process, release layer 1012 facilitates removal of substrates 111 that do not decompose during the reflow process.

The invention therefore provides a method for attaching solder to a substrate that facilitates precise alignment of the solder with desired locations on the substrate. Because only the decal requires alignment, precise alignment of all solder with desired locations on the ball grid array package may be made through one alignment process. The invention may enhance production efficiency by screening out defective decals before shipment to a vendor. This screening process contrasts with conventional screening that may take place after attachment of solder to a ball grid array package.

The invention also allows for the formation at a central site of solder decals that may be shipped to remote locations for transferring solder to a ball grid array package. Therefore, much of the equipment conventionally used to place solder on a ball grid array can be eliminated, which may reduce the cost of forming solder on ball grid arrays. Any equipment required to produce that solder decal may reside solely at a centralized location. Formation of solder decals also facilitates delegation to third parties of a portion of the solder attachment process, which may further reduce costs. Furthermore, the invention provides a clearer solder formation process because chemical processing may be performed away from the substrate or integrated circuit.

Although the invention has been particularly shown and described by the foregoing detailed description, it will be understood by those skilled in the art that various other changes in form and detail may be made without departing from the spirit and scope of the invention.

What is claimed is:

1. A method for forming solder regions on a substrate comprising the steps of:
   forming a decal comprising a plurality of solder regions, on a first substrate, comprising solder paste;
   aligning the decal with a second substrate; and
   transferring the solder regions on the decal to the second substrate.

2. The method of claim 1 wherein the step of aligning the decal with the second substrate further comprises bringing the plurality of solder regions into contact with a portion of the second substrate.

3. The method of claim 1 wherein the step of transferring the solder paste regions comprises soaking the decal in fluid.

4. The method of claim 1 wherein the step of transferring the solder paste regions comprises a solder reflow process.

5. The method of claim 1 wherein the step of forming a decal comprises arranging the solder paste regions in a pattern corresponding to a pattern of contact pads on the second substrate.

6. The method of claim 1 wherein the step of forming a decal further comprises forming a decal comprising a release layer.

7. The method of claim 1 wherein the second substrate comprises a ball grid array.

8. A method for forming solder regions on a substrate comprising the steps of:
   forming a plurality of apertures in a first substrate;
   aligning a second substrate with the first substrate;
   placing solder paste on the first substrate;
   urging a portion of the solder paste through the apertures onto the second substrate to form a decal having a plurality of solder paste regions;
   aligning the decal with a third substrate; and
   transferring the solder paste regions to the third substrate.

9. The method of claim 8 wherein the second substrate comprises non-solderable materials.

10. The method of claim 8 and further comprising forming a release layer on the second substrate to facilitate transfer of the solder paste regions to the third substrate.

11. The method of claim 10 wherein the step of transferring the solder paste regions comprises decomposing the release layer.

12. The method of claim 8 wherein the third substrate comprises a flip-chip electronic package.

13. The method of claim 8 and further comprising removing the second substrate from the solder paste regions.

14. The method of claim 8 wherein the step of transferring the solder regions to the third substrate comprises a solder reflow process.

15. A method for forming solder regions on a substrate comprising the steps of:

aligning a stencil with a first substrate;

placing solder paste on the first substrate through the stencil to form a plurality of solder paste regions on the first substrate; and transferring a plurality of the solder paste regions to a second substrate.

16. The method of claim 15 and further forming a release layer on the first substrate to facilitate transfer of the plurality of solder paste regions to the second substrate.

17. The method of claim 16 wherein the step of transferring a plurality of solder paste regions to a second substrate comprises decomposing the release layer through heating the release layer.

18. The method of claim 16 wherein the step of transferring a plurality of solder paste regions to a second substrate comprises deactivating the release layer through photodecomposition.

19. The method of claim 16 wherein the step of transferring a plurality of solder paste regions to a second substrate comprises soaking the release layer in fluid.

20. The method of claim 15 wherein the stencil comprises a plurality of regions corresponding to a plurality of contact pads on the second substrate.

* * * * *